United States Patent [19]

Minejima et al.

[11] 4,068,229
[45] Jan. 10, 1978

[54] HIGH SPEED CODING SYSTEM FOR PCM SIGNALS WITH COARSE AND FINE CODING IN AN OVERLAPPING RANGE

[75] Inventors: Yukihiko Minejima; Masahiro Yamashita, both of Kawasaki; Haruo Tsuda, Tokyo, all of Japan

[73] Assignee: Fujitsu Ltd., Kawasaki, Japan

[21] Appl. No.: 616,868

[22] Filed: Sept. 25, 1975

Related U.S. Application Data

[63] Continuation of Ser. No. 442,073; Jan. 13, 1974, abandoned.

[51] Int. Cl.² ........................................... H03K 13/02
[52] U.S. Cl. ........................ 340/347 AD; 340/347 M
[58] Field of Search ........... 340/347 AD; 179/15 AV

[56] References Cited

U.S. PATENT DOCUMENTS

| | | | |
|---|---|---|---|
| 2,865,564 | 12/1958 | Kaiser et al. | 340/347 AD |
| 3,286,253 | 11/1966 | Leng | 340/347 AD |
| 3,311,910 | 3/1967 | Doyle | 340/347 AD |
| 3,358,281 | 12/1967 | Masel | 340/347 AD |
| 3,467,958 | 9/1969 | McKinney | 340/347 AD |
| 3,483,550 | 12/1969 | Max | 340/347 AD |
| 3,541,315 | 11/1970 | Naydan et al. | 340/347 AD |
| 3,573,796 | 4/1971 | Querishi | 340/347 AD |
| 3,588,877 | 6/1971 | Keefe | 340/347 AD |
| 3,611,355 | 10/1971 | Hartke | 340/347 AD |
| 3,623,071 | 11/1971 | Bentlye | 340/347 AD |

*Primary Examiner*—Thomas J. Sloyan
*Attorney, Agent, or Firm*—Daniel Jay Tick

[57] ABSTRACT

A high speed coding system utilizes first and second coders. Specified input bits supplied from a sample and hold circuit are first coded by the first coder during a first coding stage and are in turn coded again by the second coder during a second coding stage. The coding results of the first coder govern the generation of the initial reference voltage of the first bit for coding in the second coder in order to provide an assumption that the necessary number of bits of the first coder are already coded by the second coder. There is an overlapping coding range of the first and second coders, and the system assures that coding errors in the first coder may be corrected within the overlapping coding range through coding of the coding bits of the first coder within the overlapping coding range of the second coder.

6 Claims, 18 Drawing Figures

FIG.1 PRIOR ART

| WAVEFORM AT TERMINAL 13 |  | FIG.2A |
| WAVEFORM AT TERMINAL 21 |  | FIG.2B |
| WAVEFORM AT TERMINAL 15 |  | FIG.2C |
| WAVEFORM AT TERMINAL 23 |  | FIG.2D |
| WAVEFORM AT TERMINAL 28 |  | FIG.2E |

PRIOR ART

FIG. 4A WAVEFORM AT TERMINAL 33
FIG. 4B WAVEFORM AT TERMINAL 39
FIG. 4C WAVEFORM AT TERMINAL 51
FIG. 4D WAVEFORM AT TERMINAL 35
FIG. 4E WAVEFORM AT TERMINAL 42
FIG. 4F WAVEFORM AT TERMINAL 48

HIGH SPEED CODING SYSTEM FOR PCM SIGNALS WITH COARSE AND FINE CODING IN AN OVERLAPPING RANGE

This is a continuation application of Ser. No. 442,073, filed Feb. 13, 1974 for HIGH SPEED CODING SYSTEM, and now abandoned.

BACKGROUND OF THE INVENTION

The present invention relates to a high speed coding system. More particularly, the invention relates to a high speed coding system for converting analog signals to digital signals.

A known coding system for high speed coding is divided into two coding circuits connected to each other through an analog memory circuit which functions as a sample and hold circuit. The known coding system is said to have approximately twice the coding speed of a single coder. This is accomplished by the addition of the analog memory circuit and a few other circuits.

In the known coding system, the total number of bits to be coded is the sum of the numbers of bits of the divided respective coding circuits. However, in order to attain coding characteristics sufficient as a coder with the whole bits to be coded, it is necessary to provide divided respective coding circuits with a precision obtained from the whole bits. It is also necessary that the analog memory circuit have exacting, precise, stringent, or severe characteristics. The known coding system thus has a serious disadvantage and is therefore very difficult to produce and use.

The principal object of the invention is to provide a coding system which eliminates the disadvantage of the known coding system.

An object of the invention is to provide a coding system which functions at high speed with efficiency, effectiveness and reliability.

Another object of the invention is to provide a coding system which operates at high speed and with great precision and accuracy.

BRIEF SUMMARY OF THE INVENTION

In accordance with the invention, a high speed coding system for PCM signals comprises input means for supplying a signal to be coded. First coding means is connected to the input means for coding bits from a most significant bit to a $m^{th}$ bit corresponding to the signal to be coded during a first coding stage. Second coding means is connected to the first coding means and supplied with coded signals produced by the first coding means for providing an initial reference voltage for a second coding stage and for coding bits from an $m'^{th}$ bit to a least significant bit corresponding to the signal to be coded during the second coding stage, $m'$ being equal to or less than $m$ in magnitude. Combining means is connected to the outputs of the first and second coding means for combining the coded signals produced by the first and second coding means and compensating for coding errors ocurring in an overlapping coding range of the first and second coding means. Output means is connected to the combining means for providing the combined coded signals.

The second coding means comprises a feedback type coder.

The overlapping coding range is one bit.

The combining means comprises an adder circuit.

The second coding means includes a decoder for providing a decoded output of the coded output of the first coding means at the end of the first coding stage and provides the decoded output as a reference voltage for the first bit of the coded bits of the second coding means.

An analog memory has an output coupled to the input means and an output. The first coding means comprises a comparator having a first input coded to the input means, a second input and an output connected to the combining means. A memory has an input connected to the output of the comparator and outputs. A decoder has inputs connected to outputs of the memory and an output connected to the second input of the comparator. The second coding means comprises a comparator having a first input connected to the output of the analog memory, a second input and an output connected to the combining means. A memory has inputs connected to the outputs of the memory of the first coding means, an input connected to the output of the comparator of the second coding means and outputs. A decoder has inputs connected to the outputs of the memory and an output connected to the second input of the comparator.

The memory of the first coding means comprises a predetermined number of flip flops and the memory of the second coding means comprises a number of flip flops greater than the predetermined number.

A first shift register has an input connected to the output of the comparator of the first coding means and outputs. A second shift register has an input connected to the output of the comparator of the second coding means and outputs. The combining means comprises a plurality of flip flops having inputs and outputs and a plurality of gate means connected between the outputs of the first and second shift registers and the inputs of the flip flops. The output means comprises a parallel to series converter comprising a third shift register having a plurality of inputs connected to the outputs of the flip flops and an output providing series PCM signals.

BRIEF DESCRIPTION OF THE DRAWINGS

In order that the invention may be readily carried into effect, it will now be described with reference to the accompanying drawings, wherein.

DETAILED DESCRIPTION OF THE INVENTION

Figure 1:
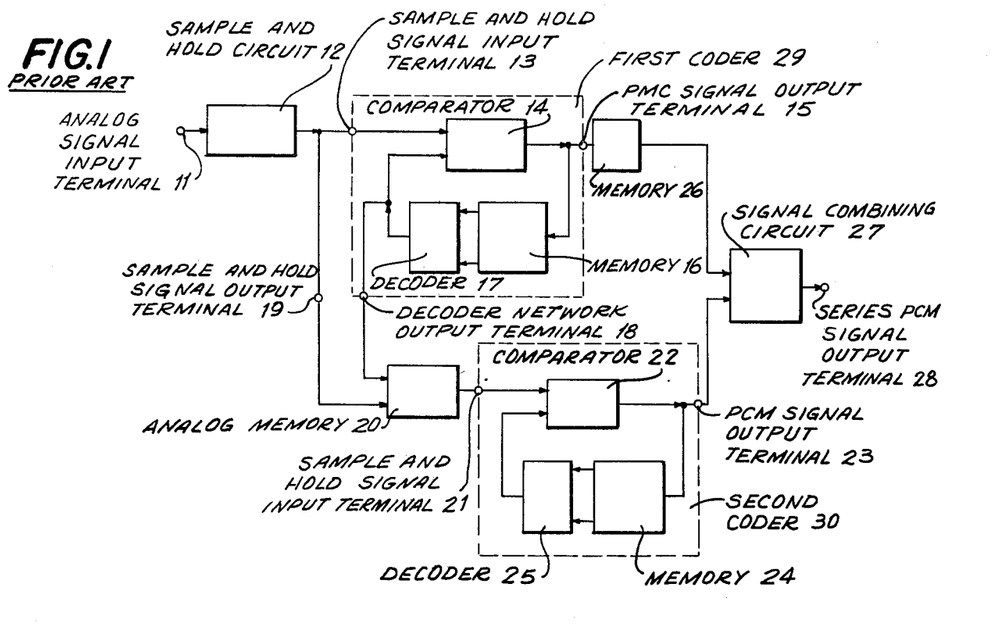
FIG. 1 is a block diagram of a known coding system.

FIG. 1 is a block diagram of a known high speed coding system. An analog signal input terminal 11 is connected to the input of a sample and hold circuit 12. The output of the sample and hold circuit 12 is connected to a first input of a comparator 14 of a first coder or encoder 29 via a sample and hold signal input terminal 13. The first coder 29 also comprises a memory 16 having an input connected to the output of the comparator 14. The outputs of the memory 16 are connected to inputs of a decoder 17. The output of the decoder 17 is connected to a second input of the comparator 14 and to a first input of an analog memory 20 via a decoder network output terminal 18.

The output of the sample and hold circuit 12 is also connected to a second input of the analog memory 20 via a sample and hold signal output terminal 19. The output of the analog memory 20 is connected to a first input of a comparator 22 of a second coder or encoder 30 via a sample and hold signal input terminal 21. The second coder 30 also comprises a memory 24 having an input connected to the output of the comparator 22. The outputs of the memory 24 are connected to inputs of a decoder 25. The output of the decoder 25 is connected to a second input of the comparator 22.

The output of the comparator 14 is connected to the input of a memory 26 via a PCM signal output terminal 15. The output of the memory 26 is connected to a first input of a signal converter or combiner 27. The output of the comparator 22 is connected to a second input of the signal combiner 27 via a PCM signal output terminal 23. The output of the signal combiner 27 is connected to a series PCM signal output terminal 28.

The first and second coders 29 and 30 are well known comparison feedback type coders. The signal combining circuit 27 couples the PCM output signals of the first and second coders 29 and 30 and produces a series PCM output signal at the terminal 28.

FIGS. 2A to 2E are a time chart for the coding of 4 bits by the coding system of FIG. 1, with 2 bits coded by each of the first and second coders 29 and 30.

The coding system of FIG. 1 operates as follows. When 4 bits are coded, each of the first and second coders 29 and 30 is allotted 2 bits. The coded PCM coupling signals are converted to series 4 bits by the signal converter or combining circuit 27.

Figure 2A:
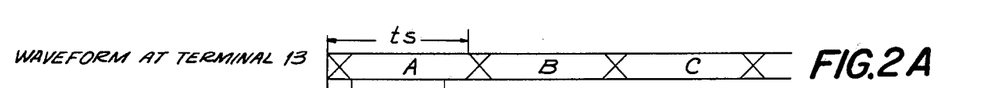
FIGS. 2A, 2B, 2C, 2D and 2E illustrate the waveforms at various points in the coding system of FIG. 1 and provide a time chart of the operation of the coding system of FIG. 1.
Figure 2B:
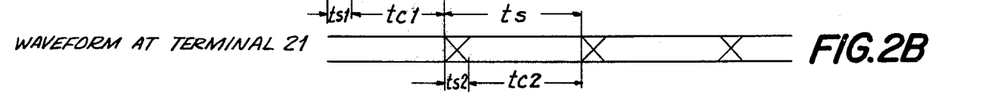
Figure 2C:
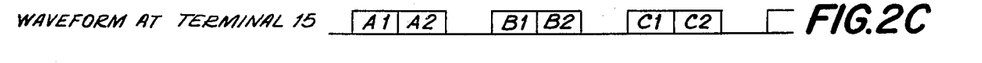
Figure 2D:
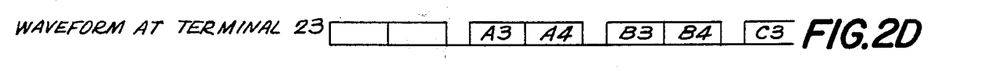
Figure 2E:
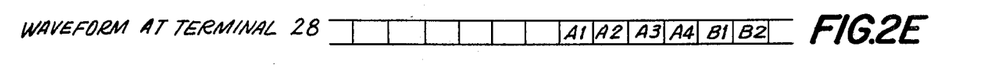

FIG. 2A shows the waveform at the sample and hold signal input terminal 13. FIG. 2B shows waveform at the corresponding sample and hold signal input terminal 21. FIG. 2C shows the waveform at the PCM signal output terminal 15. FIG. 2D shows the waveform at the corresponding PCM signal output terminal 23. FIG. 2E shows the waveform at the series PCM signal output terminal 28.

The analog input signal is sampled and held at the sample and hold circuit 12 during the sampling time ts1, as shown in FIG. 2A. Two bits A1 and A2, as shown in FIG. 2C, are coded in the first coder 29. A feedback of 2 bits is provided via a feedback loop in the first coder 29 during the coding time tc1.

After the coding time tc1, the held sample value and the output of the decoder 17 are respectively supplied to the sample and hold signal output terminal 19 and the decoder network output terminal 18 for subtraction by the analog memory circuit 20. The difference or result of the subtraction becomes the residual voltage of the coding process after the coding of 2 bits and is sampled and held in the analog memory circuit 20 further during the next sampling time ts2, as shown in FIG. 2B. The coding residual analog signal sampled and held is supplied to the second coder 30 and the remaining 2 bits A3 and A4, as shown in FIG. 2D, are coded by the second coder during the next coding time tc2.

Simultaneously, at the time tc2, the first two bits B1 and B2 of the next analog input signal are coded by the first coder 29, as shown in FIG. 2C. The PCM output signal of the first coder 29 is stored in the memory 26 until the next partial coding period. When the PCM output signal of the second coder 30 is aligned, the coder outputs A1, A2, A3, A4 obtained for the two partial coding periods are converted to a series PCM signal with a total of four bits in a sampling period by the signal converter or signal combining circuit 27, as shown in FIG. 2E. The series PCM signal is provided at the output terminal 28.

The coding characteristics or signal to quantizing noise characteristics of the known coding system of FIG. 1 require a precision of coding of more than 4 bits as the coding precision for the first coder 29 for the divided 2 bits, when it is attempted to attain the precision of 4 bits in the coding of 4 bits, even though the coding system is divided into two coders, each allotted 2 bits. That is, since the residual voltage added to the analog memory circuit 20 is assigned to the coding of up to the final fourth bit or minimum step, in the second coder 30, the residual voltage is required to have a precision high enough to code up to the final fourth bit. This requires the output of the decoder 17 of the first coder 29 to have a coding precision of more than 4 bits. If the precision fails to reach more than that of the final step with regard to the indefinite range of the comparator 14, the precision of the decoder 17, etc. of the first coder 29 causes deterioration of the characteristics.

Similarly, the analog memory 20 is required to have the characteristics for reaching the precision of the final step, the same as the first coder 29. The characteristic deterioration due to coding errors of the first coder 29, the gain variation, temperature and power drift of the analog memory 17 appears as coding errors at the bit coupling of the divided first and second coders 29 and 30, between the second and third bits in the example of FIGS. 1 and 2. Accordingly, in order to attain the coding precision of the entire coding system, the respective characteristics of the circuits of the system must be suppressed to less than the precision of the final bit. A high precision coding system may thus be realized only with very exact, precise, stringent, or severe characteristic standards being applied to all the circuits of the coding system.

On the contrary, applicants' coding system retains the advantage of almost twice the coding speed of a single coder, as does the aforedescribed known coding system, but also permits the correction of coding errors and realizes coding characteristics of high precision, even if the standard for coding errors of the first coder 29 and for the gain variation and temperature and power drift of the analog memory 20 is slackened within the range of correction of the coding errors. This is accomplished by variation of the coding structure of the known coding system of FIG. 1.

More particularly, the PCM output signal provided by the first coder 29 of FIG. 1 is arranged to set the initial coding state of the second coder 30, and the coding range of the final bit of the first coder is arranged to overlap the coding range of the second coder. This permits the correction of coding errors in the overlapping coding range in the second coder 30. The arrangements slacken the required precision of the first coder 29 and the analog memory 20 to a large extent and provide, with relative ease, high precision and accuracy for the entire coding system of the invention.

Figure 3A:
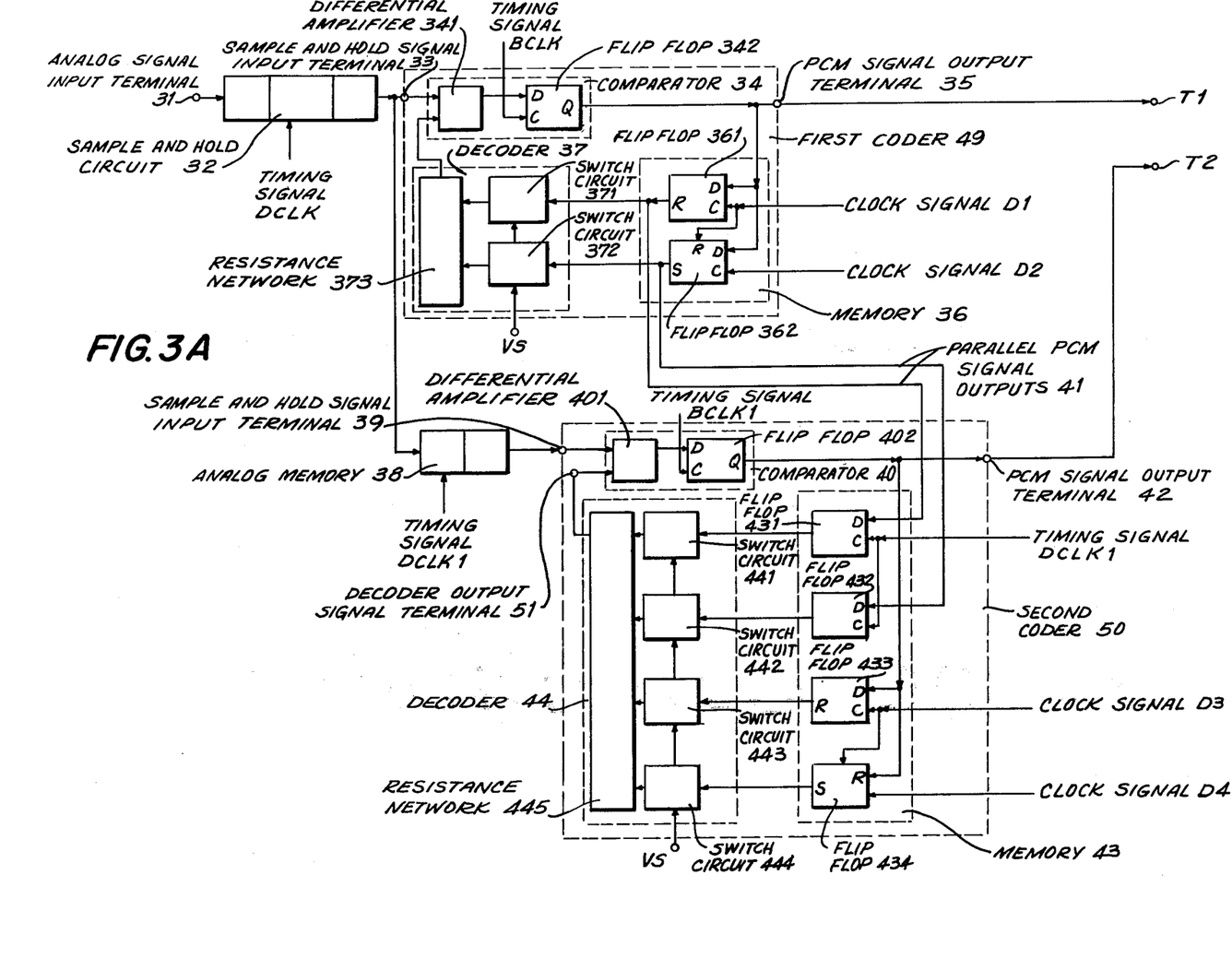
FIGS. 3A and 3B, which together form a single Figure, are a block diagram of a preferred embodiment of the coding system of the invention.
Figure 3B:
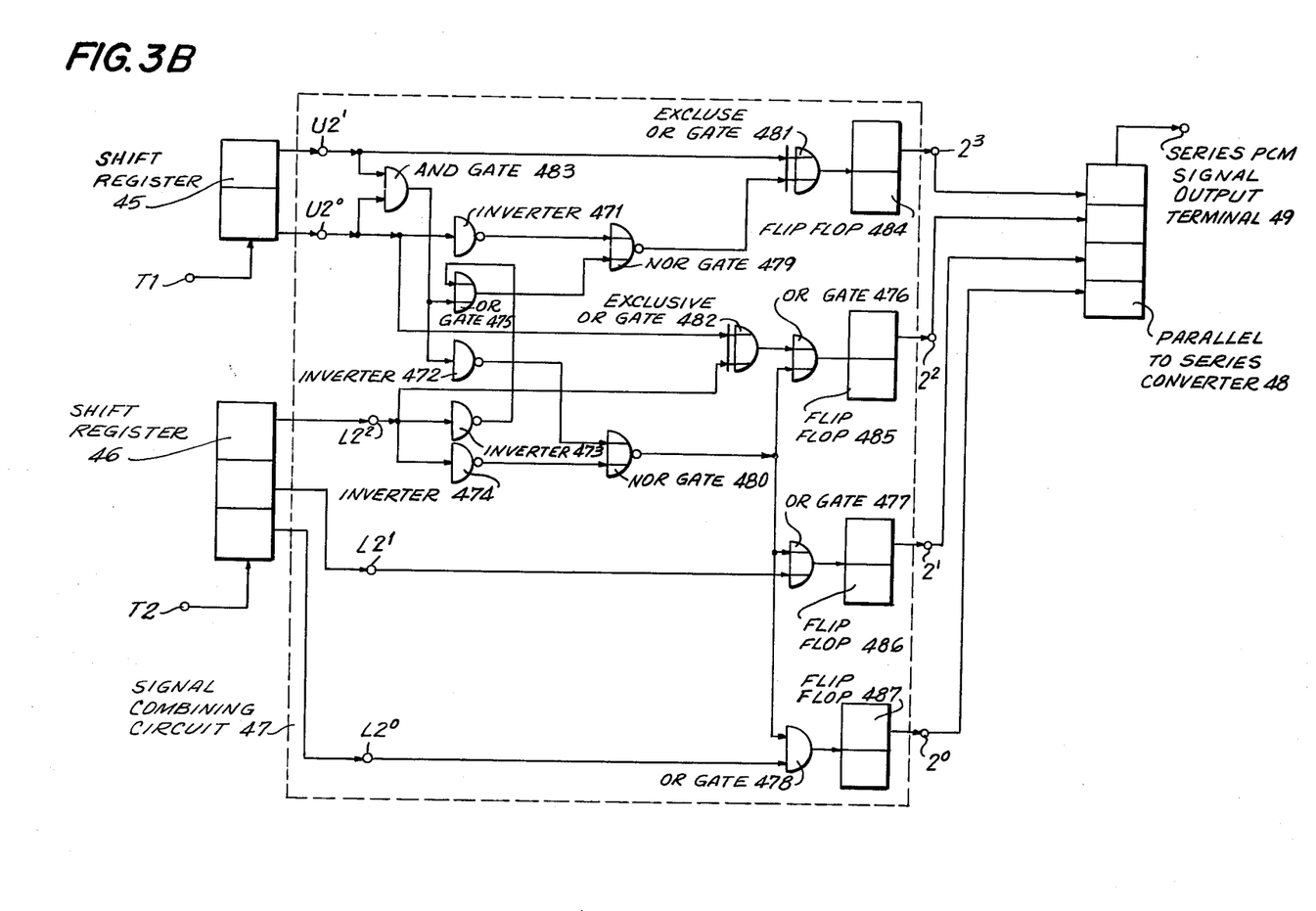

FIGS. 3A, 3B show a preferred embodiment of the high speed coding system of the invention. The coding system of FIGS. 3A, 3B comprises an analog signal input terminal 31. A sample and hold circuit 32 has an input connected to the analog signal input terminal 31. The output of the sample and hold circuit 32 is connected to a first input of a different amplifier 341 of a comparator 34 of a first coder or encoder 49 via a sample and hold signal input terminal 33. The comparator 34 also comprises a flip flop 342 having a data input connected to the output of the differential amplifier 341 and an output connected to a circuit point T1 via a PCM signal output terminal 35.

The first coder 49 further comprises a memory 36 and a decoder 37. The output of the flip flop 342 is also connected to the data input of a flip flop 361 of the memory 36 and to the data input of a flip flop 362 of said memory. The output of the flip flop 361 is connected to the input of a switch circuit 371 of the decoder 37 and the output of the flip flop 362 is connected to the input of a switch circuit 372 of said decoder. The outputs of the switch circuits 371 and 372 of the decoder 37 are connected to inputs of a resistance network 373 of said decoder. The output of the resistance network 373 is connected to a second input of the differential amplifier 341 of the comparator 34.

A second coder or encoder 50 comprises a comparator 40 having a differential amplifier 401 and a flip fop 402, a memory 43 having flip flops 431, 432, 433 and 434, and a decoder 44 having switch circuits 441, 442, 443 and 444. The output of the analog memory 38 is connected to a first input of the differential amplifier 401 via a sample and hold signal input terminal 39. The output of the differential amplifier 401 is connected to the data input of the flip flop 402 of the comparator 40. The output of the flip flop 402 is connected to a circuit point T2 via a PCM signal output terminal 42.

The output of the flip flop 402 is also connected to the set input of the flip flop 433 and to the data input of the flip flop 434. The output of the flip flop 361 of the memory 36 is also connected to the data input of the flip flop 431. The output of the flip flop 362 of the memory 36 is also connected to the data input of the flip flop 432. The output of the flip flop 431 is connected to the input of the switch 441 of the decoder 44, the output of the flip flop 432 is connected to the input of the switch circuit 442 of said decoder, the output of the flip flop 433 is connected to the input of the switch circuit 443 of said decoder and the output of the flip flop 434 is connected to the input of the switch circuit 444 of said decoder. The outputs of the switch circuits 441, 442, 443 and 444 are connected to inputs of the resistance network 445. The output of the resistance network 445 is connected to a second input of the differential amplifier 401 via a decoder output signal terminal 51.

The coding system of the invention further comprises a signal combining circuit 47, shown in FIG. 3B, and included with FIG. 3A as a single Figure. The circuit point T1 is connected to the input of a shift register 45 and the circuit point T2 is connected to the input of a and the circular point T2 is connected to th input of a shift register 46. The signal combining circuit 47 comprises terminals $U2^1$, $U2^0$, $L2^2$, $L2^1$ and $L2^0$, an AND gate 483, inverters 471, 472, 473 and 474, an OR gate 475, NOR gates 479 and 480, exclusive OR gates 481 and 482, OR gates 476, 477 and 478 and flip flops 484, 485, 486 and 487.

A first output of the shift register 45 is connected to a first input of the AND gate 483 and to a first input of the exclusive OR gate 481 via the terminal $U2^1$. A second output of the shift register 45 is connected to a second input of the AND gate 483, to the input of the inverter 471 and to a first input of the exclusive OR gate 482 via the terminal $U2^0$. The output of the inverter 471 is connected to a first input of the NOR gate 479. The output of the NOR gate 479 is connected to a second input of the exclusive OR gate 481.

The output of the AND gate 483 is connected to a second input of the OR gate 475 and to the input of the inverter 472. The output of the OR gate 475 is connected to a second input of the NOR gate 479. The second output of the shift register 45 is also connected to a first input of the exclusive OR gate 482. The output of the inverter 472 is connected to a first input of the NOR gate 480.

A first output of the shift register 46 is connected to a second input of the exclusive OR gate 482, to the input of the inverter 473 and to the input of the inverter 474 via the terminal $L2^2$. The output of the inverter 474 is connected to a second input of the NOR GATE 480. The output of the inverter 473 is connected to a first input of the OR gate 475. The output of the exclusive OR gate 482 is connected to a first input of the OR gate 476. The output of the NOR gate 480 is connected to a second input of the OR gate 476, to a first input of the OR gate 477 and to a first input of the OR gate 478.

A second output of the shift register 46 is connected to a second input of the OR gate 477 via the terminal $L2^1$. A third output of the shift register 46 is connected to a second input of the OR gate 478 via the terminal $L2^0$. The output of the exclusive OR gate 481 is connected to the input of the flip flop 484. The output of the OR gate 476 is connected to the input of the flip flop 485. The output of the OR gate 477 is connected to the input of the flip flop 486. The output of the OR gate 478 is connected to the input of the flip flop 487.

A parallel to series converter 48 comprising a shift register has a plurality of inputs connected to the corresponding outputs of the flip flops 484, 485, 486 and 487, respectively, of the signal combining circuit 47 via terminals $2^3$, $2^2$, $2^1$ and $2^0$, respectively. The output of the shift register 48 is connected to a series PCM signal output terminal 49.

The sample and hold circuit 32 comprises any suitable known circuit such as, for example, a diode switch and a holding capacitor. The memories 36 and 43 comprise logic memory circuits which perform the logical operation of the PCM outputs and store the results. The analog memory 38 comprises a sample and hold circuit. Although the first and second coders 49 and 50 are shown as feedback type coders or encoders, it is sufficient if at least the second coder 50 is a feedback type coder. The shift register 45 is a memory circuit which temporarily stores the PCM signal output of the first coder 49. The shift register 46 is a coupling circuit which couples the PCM output signals of the first and second coders 49 and 50 to the signal converter or signal combining circuit 47, which delivers the coupled PCM output signal as a series PCM signal.

FIGS. 4A to 4F are a time chart of the coding system of the invention, as shown in FIGS. 3A and 3B. The time chart of FIGS. 4A to 4F illustrates a case where the total number of four bits, as in the system of FIG. 1, two bits and three bits are allotted to the first and second coders 49 and 50, respectively, although the coding system of the invention is not so limited.

In accordance with the invention, the coded bits allotted to the first coder 49 may be generally taken as the bits from the most significant one to $m^{th}$ one, and the bits allotted to the first coder 50 may be taken as the bits from the $m'^{th}$ one to the least significant one, where $m$ is equal to or greater than $m'$ in magnitude.

FIGS. 5A, 5B, 5C and 5D illustrate error correction in the coding process of the coding system of FIGS. 3A and 3B.

The coding system of the invention is described in operation, with reference to FIGS. 3A, 3B, 4A to 4F and 5A to 5D, as follows. In the coding of 4 bits, the allotment or allocation of 2 bits and 3 bits to the first and second coders 49 and 50, respectively, and the coupling of the coded PCM output signals at the coupling circuit 46 to provide a 4 bit signal, permit the correction of errors. The signal is then converted into a 4 bit series PCM signal by the signal combining circuit 47.

Figure 4A:
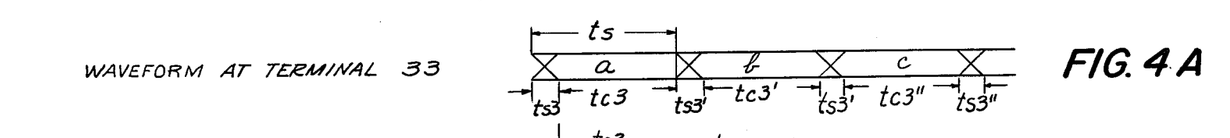
FIGS. 4A, 4B, 4C, 4D, 4E and 4F illustrate the waveforms at various parts in the coding system of the invention shown in FIGS. 3A and 3B and provide a time chart of operation of the coding system of the invention.
Figure 4B:
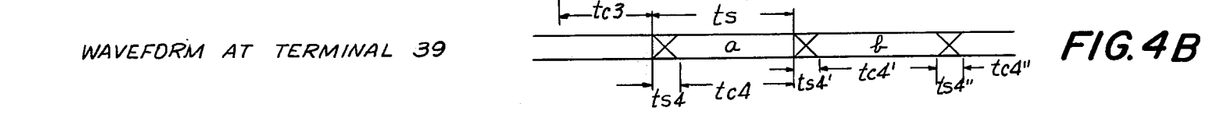
Figure 4C:
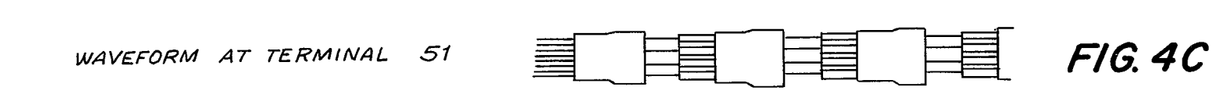
Figure 4D:
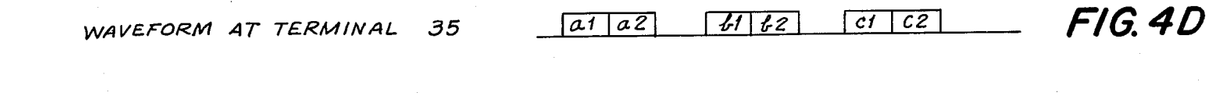
Figure 4E:
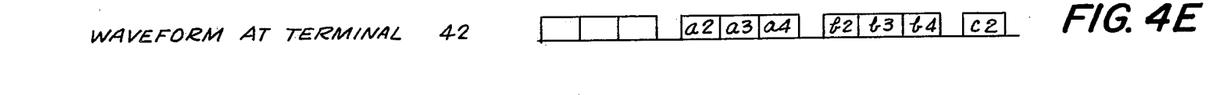
Figure 4F:
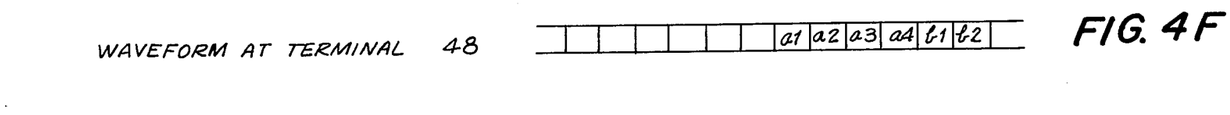

FIG. 4A shows the waveform at the sample and hold signal input terminal 33. FIG. 4B shows the waveform at the corresponding sample and hold signal input terminal 39. FIG. 4C shows the output waveform of the decoder 44 of the first coder 50 at the decoder output signal terminal 51. FIG. 4D shows the waveform at the PCM signal output terminal 35. FIG. 4E shows the waveform at the corresponding PCM signal output terminal 42. FIG. 4F shows the waveform at the series PCM signal output terminal 49.

A timing or clock DCLK is supplied to the sample and hold circuit 32. A timing or clock signal DCLK1 is supplied to the analog memory 38 and to the reset inputs of the flip flops 431 and 432. A timing or clock signal BCLK is supplied to the clock input of the flip flop 432. A timing or clock signal BCLK1 is supplied to the clock input of the flip flop 402. A clock signal D1 is supplied to the clock input of the flip flop 361 and to the flip flop 362. A clock signal D2 is supplied to the clock input of the flip flop 362. A clock signal D3 is supplied to the clock input of the flip flop 433 and to the flip flop 434. A clock signal D4 is supplied to the clock input of the flip flop 434.

The analog input signal is sampled by the timing signal DCLK during sampling times ts3, ts3', ts3'' by the sample and hold circuit 32 and is held during the times tc3, tc3', tc3'', as shown in FIG. 4A. The signal is then supplied through the input terminal 33 to the input of the differential amplifier 341 of the comparator 34. The reference voltage from the decoder 37 is applied to the other input of the differential amplifier 341. Therefore, the output of the differential amplifier 341 is inverted in polarity in accordance with whether or not the input is larger than the reference voltage. The output of the differential amplifier 341 becomes the triggering input of the flip flop 342. Therefore, in synchronization with the timing or clock signal BCLK, the flip flop 342 is set to "1" or "0" according to the polarity of the output of the differential amplifier 341.

The output of the flip flop 342 is supplied to the input of the memory circuit 45 of FIG. 3B through the output terminal 35 and the circuit point T1 as the first bit coding output $a$ and also to the input of the logic memory circuit 36. The logic memory circuit 36 comprises the flip flops 361 and 362. In the illustrated example, the coding of 2 bits is allocated to the first coder 49, and generally the number of flip flop circuits of the memory circuit 36 corresponds to that of the number of bits allocated. The clock signals D1 and D2 provide the set timing of the flip flops 361 an 362 in series. Therefore, when the coded output of the first bit is provided at the PCM signal output terminal 35, the flip flop 361 is set to "1" or "0" according to such output.

Meanwhile, the decoder 37 includes the resistance network 373 to which a constant voltage Vs is applied via the switch circuits 371 and 372 which are controlled in switching according to the condition of the flip flops 361 and 362 of the logic circuit 36. Accordingly, one of four types of voltage is selected according to the switching conditions of the switch circuits 371 and 372 as the output voltage and the resistance network 373. The output voltage of the resistance network 373 becomes the reference voltage for the coding of the next bit to be supplied to the input of the differential amplifier 341 of the comparator 34.

Then, when the second bit is coded by the first coder 49, the flip flop 362 is set according to the coding output. At the same time the coding output corresponding to 2 bits a1 and a2 is stored in the shift register 45 of FIG. 3B during the time tc3, as shown in FIG. 4D. As hereinbefore indicated, the invention does not require that the first coder 49 be a feedback type coder or encoder. The first coder 49 may be considered a general coder or encoder for performing the coding of 2 bits a1a2, b1b2, c1c2, respectively, during the time periods tc3, tc3', tc3''...

In the meantime, the held sample value of the sample and hold circuit 32 is also supplied to the analog memory circuit 38 as it is, and, upon the completion of coding by the first coder 49, coding by the second coder 50, it is sampled by the timing signal DCLKI at said analog memory circuit for the sampling times ts4, ts4', ts4''... and is held during the respective coding periods tc4, tc4', tc4''...

Simultaneously, during the period tc3, for example, the PCM signal outputs of the coded 2 bits of the first coder 49 are provided as parallel PCM signal outputs from the logic memory circuit 36 through lines 41 to inputs of the second coder 50 to set the flip flops 431 and 432 of the logic memory circuit 43 of the second coder by the timing of the timing or clock signal DCLKI before the start of coding by the second coder 50, upon the completion of coding by the first coder 49.

The decoder 44 comprises the switch circuits 441, 442, 443 and 444 and the resistance network 445 corresponding to the decoder 37 of the first coder 49, and operates the same as the decoder 37. In the illustrated embodiment of the invention, the number of flip flops of the memory or logic network 43 and the number of switch circuits of the decoder 44 are 4, because the total number of bits to be coded is 4, although the invention is not limited to this example. In the coding system of the invention, as hereinbefore mentioned, upon the completion of coding by the first coder 49, since in this example 2 bits are allocated for coding by said first coder, one of 4 reference voltages is provided by the decoder in accordance with the coding results, as shown in FIG. 4C.

Accordingly, the signal from the analog memory 38 is supplied to an imput of the differential amplifier 401 of the comparator 40 of the second coder 50. The analog memory 38 holds the sample and hold input signal of the first coder 49, as shown in FIG. 4B. The signal from the decoder 44 is supplied to another input of the differential amplifier 401. As shown in FIG. 4C, the decoder 44 decodes the PCM output signal coded by the first coder 49 and provides the reference voltage of the first bit of the second coder 50 upon the completion of the coding by the first coder as if 2 bits have already been coded by the second coder. As shown in FIG. 4B, the output signal of the analog memory 38, sampled and held at the sampling times ts4, ts4', ts4". . . codes 3 bits a2, a3, a4, for example, during the period ts4, as shown in FIG. 4E, in the comparator 40, the memory 43 and the decoder 44 of the second coder 50. The second coder 50 has a feedback loop. The coding is accomplished by 2 bits plus one surplus bit for error correction, as hereinafter described, in the same operation as that described for the first coder 49 in the coding periods tc4, tc4', tcc4". . . Simultaneously, the next analog input signal for the first 2 bits b1 and b2, as shown in FIG. 4D, is coded by the first coder 49. And the 3 bit coding output of the second coder 50 is supplied to the input of the shift register 46 of FIG. 3B.

In the coding system of the invention, coding errors of the first coder 49 and coding errors due to variations in the analog memory 38 may be corrected by coupling the outputs of the first and second coders 49 and 50. This is described with reference to FIGS. 5A and 5D, on the basis of FIG. 3B.

The shift registers 45 and 46 of FIG. 3B comprise flip flops and are of known type and convert the series coded outputs from the first and second coders 49 and 50 to parallel coded signals.

The signal combining circuit 47 couples the output of the most significant bit and the second bit from the shift register 45 with the output of the first bit coded to the least significant bit from the shift register 46. The signal combining circuit 47 may be considered an adder circuit simply with an adding function. The shift register 48 comprises a plurality of flip flops and functions to convert the coupled parallel coded output to a series coded output, and provides a coded 4 bit output at the series PCM signal output terminal 49.

Figure 5A:
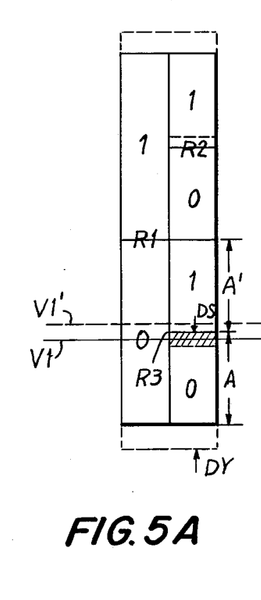
FIGS. 5A, 5B, 5C and 5D show error correction in the coding process of the coding system of the invention.
Figures 5B, 5C:
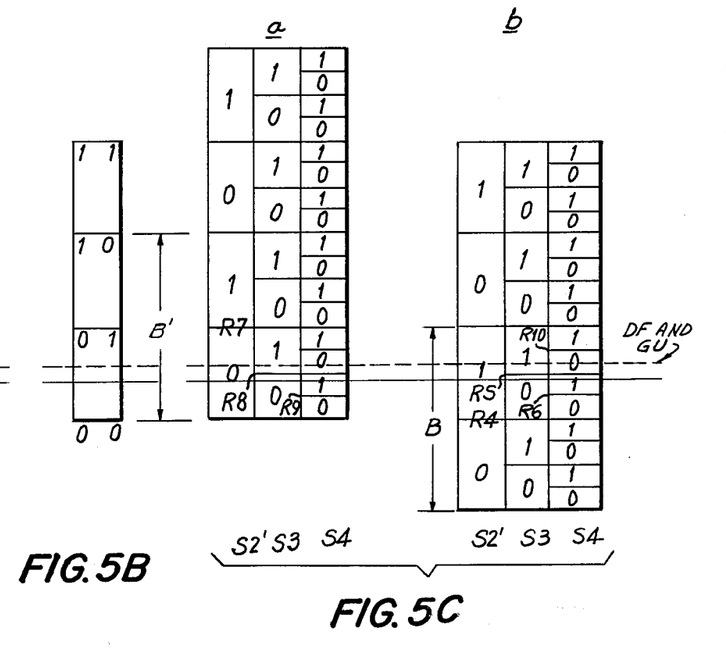

As shown in FIG. 5A, if the reference voltages in the first coder 49 are assumed to be R1, R2, R3 to the sample and hold input signal, the sample and hold signal shown by the solid line V1, applied to the input of the first coder 49, is coded to 0, 0. Therefore, the flip flops 431 and 432 of the second coder 50 are respectively set to 0, 0 and reference voltages of 0, 0 are set by the decoder 44, as shown in FIG. 5B. In a conventional coding system, the coding range of the second coder 50 becomes the range shown by A in FIG. 5A, whereas in the coding system of the invention, due to overlapping of the final bit of the first coder 49 on the first bit of the second coder 50, the coding range has an overlapped portion relative to the first coder 49, as shown by B in FIG. 5C.

Therefore, coding by the second coder 50 provides 1, 0, 1 with reference voltages R5 and R6 being provided in the coding range shown in part b of FIG. 5C, starting from an initial reference voltage R4, shown in part b of FIG. 5C. Accordingly, a logic signal 0, 0, 1, 0, 1 is provided at the terminals U2¹, U2⁰, L2², L2¹, L2⁰ of the signal combining circuit 47 of FIG. 3B. When 0 0 and 1 0 1 are added, the flip flops 484, 485, 486 and 487 are set to 0 1 0 1.

Errors may occur when the sample and hold input signals shown by the solid line level V1 is in the condition DS in the indefinite range of the comparator 34, or in the condition DY of non-coincidence of the dynamic range of the second coder 50, shown in FIG. 5A.

Figure 5D:
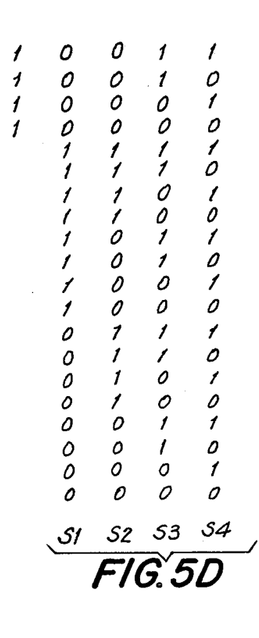

The coding of the signal V1 to 0, 1 in that range by the first coder 49 provides a reference voltage of 0, 1, as shown in FIG. 5B, and the coding by the second coder 50 provides a logic signal 0, 0, 1 in the coding range B', shown in part a of FIG. 5C. The logic signal starts from the initial reference voltage R7. Additional reference voltages R8 and R9 are provided at the output of the decoder 44. This provides the PCM output signal of 0, 1, 0, 1 by providing the sum of the output signal of the first coder 49 and the output signal of the second coder 50 at the shift register 46, as shown in FIG. 5D. Thus, errors due to the indefinite range of the comparator 34, non-coincidence of the dynamic range of the second coder 50, etc. are corrected.

Even if a coded output signal of 0, 0 is provided for an input signal missing in the coding range A, for example, in the coding process of the second bit of the first coder 49, as shown in FIG. 5A, the second bit is coded again in the coding range B by the first bit of the second coder 50, inevitably correcting errors in the output of the shift register 46.

The second cause of errors is considered to be the influence of the temperature and power drift DF and gain variation GV, shown in FIG. 5C, in the analog memory 38. When the sample and hold input signal V1 is supplied in the first coder 49, it is coded to 0, 0, as shown in FIG. 5A, if the aforedescribed first cause of errors is not present in said first coder.

However, the signal V1 is supplied as a broken line level V1', as the sample and hold input signal to the second coder 50. The signal is influenced by the temperature and power drift DF and the gain variation GV in the analog memory 38. Thus, as shown in FIG. 5B, the reference voltage 0, 0 is provided by the decoder 44 of the second coder 50, and the coding produces a logic signal 1, 1, 0, as shown in part a of FIG. 5C. The coding range starts from the initial reference voltage R4, shown in part b of FIG. 5C. Additional reference voltages R5 and R10 are provided, as shown in part b of FIG. 5C, resulting in the PCM output signal of 0, 1, 1, 0. The PCM output signal is the sum of the output signal S1, S2, as shown in FIGS. 5A and 5D, of the first coder 49 and the output signal S2', S3, S4, as shown in FIG. 5C, of the second coder 50, which is the same coding as if the sample and hold input signal V1' is applied to the first coder 49 from the beginning. Since variation in the analog memory 38 is constant during steady operation, the consideration of the variation corrects the variation equivalently.

When the sum of the binary coded output signals of the first and second coders 49 and 50 is provided by the signal combining circuit 47, the output may be obtained with the voltage of the second coder 50 as a reference voltage.

If coding by the first coder 49 provides a logic signal 1, 1 and if the first bit of the signal of the second coder 50 is 1, the codes S1, S2, S3, S4 are the same as the output signal when coding by said first coder provides a logic signal 0, 0, as shown in FIG. 5D. Accordingly, if, in such case, the signal combining circuit 47 is operated only to provide an output signal 1, 1, 1, 1, it is possible to correct errors. The AND gate 483 of the signal combining circuit 47 performs this function. The output logic of the AND gate 483 is constructed to provide a logical "1" when the terminals U2¹ and U2⁰ both provide logical "1" signals. When the coded output signals S1, S2 of the first coder 49 and 1, 1, the flip flops 484, 485, 486 and 487 are set to be "1" through the OR gate circuits 476, 477 and 478.

As hereinbefore described, the PCM output signal of the first coder 49 is stored in the shift register 45 until the next coding period and is read by the signal combining circuit 47 when the PCM output signal of the second coder 50 is aligned in the shift register 46, to correct coding errors in said first coder and in the analog memory 38, but in the overlapping coding range. The PCM output signals provided during the two partial sampling periods are converted to a parallel PCM signal having a total of 4 bits and one sampling period. Furthermore, it is provided at the output terminal 49 as a series PCM output signal a1, a1, a3, a4, as shown in FIG. 4F, after signal coversion by the shift register 48.

As hereinbefore described in detail, in the coding system of FIG. 1, the decoder 17 is operated by the coded result provided by the first coder 29, which is part of the system, to provide an analog output in accordance with the coded bits of said first coder. The analog memory 20 provides the difference between the sample and hold signal supplied to the first coder 29 and the output of the decoder 17 to code the residual sample and hold signal in the second coder 30. In the coding system of the invention, as shown in FIGS. 3A and 3B, however, the decoder 44, operated by the coded result provided by the first coder 49, is connected in the second coder 50, which is connected to the output of the analog memory 38. The analog memory 38 is thus simply for sampling and holding the input signal. The supply to the input of the comparator 40 of the second coder 50 is made to compare with the output of the decoder 44 based on the coded result of the first coder 49, to have the same effect as the difference provided by the analog memory 20 of the coding system of FIG. 1.

This eliminates the operation of subtraction in the analog memory, and the decoder output is arranged to be decided by the precision of the decoder 44 of the second coder 50. The coding range of the second coder 50 is always arranged to be overlapped, to enable the correction of coding errors in the overlapped coding range via the signal combining circuit 47.

Therefore, the exact or precise characteristics required in the first coder 29 and the analog memory 20 of the coding system of FIG. 1 may be relaxed. The relaxed range of the characteristics corresponding to the overlapped coding range of the second coder 50 of the coding system of the invention and the respective characteristics of the coding errors of the first coder 49, the coding errors due to non-coincidence of the dynamic ranges of said first and second coders, and the temperature and power drift and gain variation of the analog memory are relaxed by adding circuitry to the coding system of FIG. 1 to produce the coding system of the invention.

The characteristics of the coding system of the invention as a whole depend upon the coding characteristics of the second coder 50 in a range in which errors may be corrected in said second coder. The increased precision of the second coder 50 results in high speed, high precision and accuracy for the coding system as a whole, with relative ease and facility.

Although the first coder 49 of the coding system of the invention is shown as being a feedback type coder, said first coder may comprise any suitable type of coder.

In the foregoing description of operation of the illustrated embodiment of the invention, a four bit code is utilized as an example of the description of the overlapping coding of the second bit in the first and second coders 49 and 50. Since in such case $m$ equals $m'$ equals 2, it is understood that the technical range of the invention is not limited to the embodiment of 4 bits.

While the invention has been described by means of a specific example and in a specific embodiment, we do not wish to be limited thereto, for obvious modifications will occur to those skilled in the art without departing from the spirit and scope of the invention.

We claim:

1. A high speed coding system for coding an input signal into a PCM signal during first and second coding stages, said coding system comprising
   input means for supplying an input signal to be coded;
   sample and hold means connected to the input means for sampling and holding the input signal;
   first coding means for coding bits from a most significant bit to an $m^{th}$ bit corresponding to the sampled and held input signal of the sample and hold means during the first coding stage, the first coding means having an output;
   analog memory means connected to the sample and hold means for holding the sampled and held input signal during the second coding stage;
   second coding means having a feedback loop including a decoder, said decoder providing an initial reference voltage corresponding to the output of the first coding means for the first bit to be coded of the second coding stage for coding bits from an $m'^{th}$ bit to a least significant bit corresponding to the held signal of the analog memory means during the second coding stage, $m'$ being equal to or less than $m$ magnitude, the second coding means having an output;
   combining means connected to the outputs of the first and second coding means for adding the coded signals produced by the first coding means to the coded signals produced by the second coding means to provide a digital output signal representative of the sampled and held input signal; and
   output means connected to the combining means for providing the digital output signal of the combining means in series.

2. A high speed coding system as claimed in claim 1, wherein the overlapping coding range is one bit.

3. A high speed coding system as claimed in claim 1, wherein the first coding means comprises a comparator having a first input coupled to the sample and hold means, a second input and an output connected to the combining means, a memory having an input connected to the output of the comparator and outputs and a decoder having inputs connected to outputs of the memory and an output connected to the second input of the comparator, and the second coding means further comprises a comparator having a first input connected to the output of the analog memory, a second input connected to the output of the decoder of the second coding means and an output connected to the combining means, and a memory having first inputs connected to the outputs of the memory of the first coding means, a second input connected to the output of the comparator of the second coding means and outputs connected to the inputs of the decoder of the second coding means.

4. A high speed coding system as claimed in claim 3, wherein the memory of the first coding means comprises a predetermined number of flip flops and the memory of the second coding means comprises a number of flip flops greater than the predetermined number.

5. A high speed coding system for PCM signals, comprising input means for supplying a signal to be coded;

an analog memory having an input coupled to the input means and an output;

first coding means connected to the input means for coding bits from a most significant bit to an $m^{th}$ bit corresponding to the signal to be coded during a first coding stage, the first coding means comprising a comparator having a first input coupled to the input means, a second input and an output connected to the combining means, a memory having an input connected to the output of the comparator and outputs, said memory having a predetermined number of flip flops, and a decoder having inputs connected to outputs of the memory and an output connected to the second input of the comparator, the first coding means having an output;

second coding means connected to the first coding means and supplied with coded signals produced by the first coding means for providing an initial reference voltage for a second coding stage and for coding bits from an $m'^{th}$ bit to at least significant bit corresponding to the signal to be coded during the second coding stage, $m'$ being equal to or less than $m$ in magnitude, the second coding means comprising a comparator having a first input connected to the output of the analog memory, a second input and an output connected to the combining means, a memory having inputs connected to the outputs of the memory of the first coding means, an input connected to the output of the comparator of the second coding means and outputs, the memory of the second coding means comprising a number of flip flops greater than the predetermined number, and a decoder having inputs connected to the outputs of the memory and an output connected to the second input of the comparator, the second coding means having an output;

a first shift register having an input connected to the output of the comparator of the first coding means and outputs and a second shift register having an input connected to the output of the second coding means and outputs;

combining means connected to the outputs of the first and second coding means for adding the coded signals produced by the first coding means to the coded signals produced by the second coding means to provide a digital output signal; and output means connected to the combining means for providing the digital output signal of the combining means in series.

6. A high speed coding system for PCM signals, comprising input means for supplying a signal to be coded;

an analog memory having an input coupled to the input means and an output;

first coding means connected to the input means for coding bits from a most significant bit to an $m^{th}$ bit corresponding to the signal to be coded during a first coding stage, the first coding means comprising a comparator having a first input coupled to the input means, a second input and an output connected to the combining means, a memory having an input connected to the output of the comparator and outputs, said memory having a predetermined number of flip flops, and a decoder having inputs connected to outputs of the memory and an output connected to the second input of the comparator, the first coding means having an output;

second coding means connected to the first coding means and supplied with coded signals produced by the first coding means for providing an initial reference voltage for a second coding stage and for coding bits from an $m'^{th}$ bit to a least significant bit corresponding to the signal to be coded during the second coding stage, $m'$ being equal to or less than $m$ in magnitude, the second coding means comprising a comparator having a first input connected to the output of the analog memory, a second input and an output connected to the combining means, a memory having inputs connected to the outputs of the memory of the first coding means, an input connected to the output of the comparator of the second coding means and outputs, the memory of the second coding means comprising a number of flip flops greater than the predetermined number, and a decoder having inputs connected to the outputs of the memory and an output connected to the second input of the comparator, the second coding means having an output;

a first shift register having an input connected to the output of the comparator of the first coding means and outputs and a second shift register having an input connected to the output of the second coding means and outputs;

combining means connected to the outputs of the first and second coding means for combining the coded signals produced by the first and second coding means and compensating for coding errors occurring in an overlapping coding range of the first and second coding means, said combining means comprising a plurality of flip flops having inputs and outputs and a plurality of gate means connected between the outputs of the first and second shift registers and the inputs of the flip flops; and output means connected to the combining means for providing the combined coded signals, said output means including a parallel to series converter comprising a third shift register having a plurality of inputs connected to the outputs of the flip flops and an output providing series PCM signals.

* * * * *